(12) United States Patent
Lee et al.

(10) Patent No.: US 9,105,694 B2
(45) Date of Patent: Aug. 11, 2015

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Jong-Ho Lee, Hwaseong-si (KR); Min-Keun Kwak, Suwon-si (KR); Bum-Joon Youn, Suwon-si (KR); Sung-Won Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/286,170

(22) Filed: May 23, 2014

(65) Prior Publication Data

US 2015/0004783 A1   Jan. 1, 2015

(30) Foreign Application Priority Data

Jun. 27, 2013 (KR) ........................ 10-2013-0074695

(51) Int. Cl.
| | | |
|---|---|---|
| *H01L 21/44* | (2006.01) | |
| *H01L 21/768* | (2006.01) | |
| *H01L 29/423* | (2006.01) | |
| H01L 21/8234 | (2006.01) | |
| H01L 27/108 | (2006.01) | |
| H01L 29/66 | (2006.01) | |

(52) U.S. Cl.
CPC ...... *H01L 21/76843* (2013.01); *H01L 29/4236* (2013.01); *H01L 21/823437* (2013.01); *H01L 27/10876* (2013.01); *H01L 29/66545* (2013.01)

(58) Field of Classification Search
CPC ..................... H01L 29/4236; H01L 29/66545; H01L 27/10876; H01L 21/823437

USPC ........................................... 438/653, 654, 656
See application file for complete search history.

(56) References Cited

U.S. PATENT DOCUMENTS

| | | | |
|---|---|---|---|
| 8,048,810 B2 | 11/2011 | Tsai et al. | |
| 8,252,675 B2 | 8/2012 | Lee et al. | |
| 8,310,012 B2 | 11/2012 | Hwang et al. | |
| 8,334,197 B2 | 12/2012 | Lee et al. | |
| 8,377,771 B2 | 2/2013 | Rachmady et al. | |
| 2011/0248359 A1* | 10/2011 | Hwang et al. | 257/410 |
| 2011/0256700 A1* | 10/2011 | Chang et al. | 438/585 |
| 2011/0275210 A1* | 11/2011 | Denison et al. | 438/589 |
| 2012/0129331 A1 | 5/2012 | Choi et al. | |
| 2012/0217578 A1* | 8/2012 | Lim et al. | 257/330 |
| 2012/0313178 A1 | 12/2012 | Liao et al. | |
| 2012/0319198 A1* | 12/2012 | Chien et al. | 257/333 |
| 2012/0319205 A1* | 12/2012 | Hempel et al. | 257/368 |
| 2013/0005133 A1 | 1/2013 | Lee et al. | |
| 2013/0017670 A1 | 1/2013 | Lenski et al. | |
| 2013/0020657 A1 | 1/2013 | Lu et al. | |
| 2013/0049142 A1 | 2/2013 | Liu et al. | |

\* cited by examiner

*Primary Examiner* — Karen Kusumakar
(74) *Attorney, Agent, or Firm* — Lee & Morse, P.C.

(57) ABSTRACT

A method for making a semiconductor device includes forming a trench in a first layer on a substrate. A conductive layer having a pattern is formed in the trench. A first metal gate electrode is formed on the conductive layer, and a second metal gate electrode is formed on the first metal gate electrode. The first and second metal gate electrodes at least partially conform to the pattern of the conductive layer. Widths of first surfaces of the first and second metal gate electrodes are different from respective widths of second surfaces of the first and second metal gate electrodes as a result of the pattern.

15 Claims, 14 Drawing Sheets

METHOD FOR FABRICATING SEMICONDUCTOR DEVICE

CROSS-REFERENCE TO RELATED APPLICATION

Korean Patent Application No. 10-2013-0074695 filed on Jun. 27, 2013, and entitled, "METHOD FOR FABRICATING SEMICONDUCTOR DEVICE," is incorporated by reference herein in its entirety.

BACKGROUND

1. Field

One or more embodiments described herein relate to a semiconductor device.

2. Description of the Related Art

Efforts are continually being made to improve semiconductor devices. One effort involves replacing polysilicon gates with metal gates. This replacement, however, does not come without a cost. For example, more process operations must be performed to make a semiconductor device with metal gates. The number of process operations increases when attempts are made to reduce the scale of the device. For example, a replacement metal gate process must include multiple etching, depositing, and polishing operations to reduce the scale of a semiconductor device using a metal gate.

SUMMARY

In accordance with one embodiment, a method for fabricating a semiconductor device includes forming an interlayer insulating layer on a substrate, the interlayer insulating layer including a first trench; forming a first conductive layer along side and bottom surfaces of the first trench; forming a first pre-mask pattern on the first conductive layer, the first pre-mask pattern filling a part of the first trench; changing the first pre-mask pattern into a first mask pattern through a first bake process; and removing the first conductive layer exposed by the first mask pattern to form a first conductive layer pattern. The first pre-mask pattern may be a developable bottom anti-reflective coating (dBARC) pattern, and the first mask pattern may be a bottom anti-reflective coating (BARC) pattern.

Forming the first pre-mask pattern may include forming a pre-mask film on the first conductive layer, the pre-mask film filling the first trench; thermally treating the pre-mask film through a second bake process; and etching-back the thermally treated pre-mask film to expose a part of the first conductive layer on the side of the first trench. The first bake process may be performed at a temperature greater than the second bake process.

Forming the first pre-mask film may include removing part of the pre-mask film filling the first trench by a wet etch back process. Forming the first conductive layer pattern may include removing part of the first conductive layer exposed by the first mask pattern using a wet etching. The first conductive layer may include at least one of TaN or TiN.

The interlayer insulating layer may include a second trench that has a width different from that of the first trench, and the method may include forming a second conductive layer along side and bottom surfaces of the second trench; forming a second pre-mask pattern on the second conductive layer, the second pre-mask pattern filling part of the second trench and having substantially a same thickness as the first pre-mask pattern; changing the second pre-mask pattern into a second mask pattern through the first bake process; and removing the second conductive layer exposed by the second mask pattern to form a second conductive layer pattern.

A height of the first conductive layer pattern that extends along the side surface of the first trench may be a first height, and a height of the second conductive layer pattern that extends along the side surface of the second trench may be a second height, and the first height may be substantially equal to the second height.

In accordance with another embodiment, a method for fabricating a semiconductor device includes forming an interlayer insulating layer on a substrate, the interlayer insulating layer including a first trench and a second trench; forming a first conductive layer along side and bottom surfaces of the first trench and a second conductive layer along side and bottom surfaces of the second trench; forming a first pre-mask pattern and a second pre-mask pattern filling parts of the first trench and the second trench on the first conductive layer and the second conductive layer, respectively; changing the first pre-mask pattern and the second pre-mask pattern into a first mask pattern and a second mask pattern through a first bake process; removing the first conductive layer exposed by the first mask pattern to form a first conductive layer pattern; removing the second conductive layer exposed by the second mask pattern to form a second conductive layer pattern; and removing the second conductive layer pattern.

Each of the first and second pre-mask patterns may be a developable bottom anti-reflective coating (dBARC) pattern, and each of the first and second mask patterns may be a bottom anti-reflective coating (BARC) pattern. The first trench may be formed in a PMOS region and the second trench may be formed in an NMOS region.

Each of the first conductive layer and the second conductive layer may include a p-type work function regulating layer, and each of the first conductive layer and the second conductive layer may include at least one of TaN or TiN.

Forming of the first pre-mask pattern and the second pre-mask pattern may include forming a pre-mask film filling the first trench and the second trench on the first conductive layer and the second conductive layer; thermally treating the pre-mask film through a second bake process; and wet etching-back the thermally treated pre-mask film to expose part of the first conductive layer formed on the side surface of the first trench and part of the second conductive layer formed on the side surface of the second trench. The first conductive layer pattern and the second conductive layer pattern may be formed using a wet etching.

In accordance with another embodiment, a method for making a semiconductor device includes forming a trench in a first layer on a substrate; forming a conductive layer having a pattern in the trench; forming a first metal gate electrode on the conductive layer; and forming a second metal gate electrode on the first metal gate electrode, wherein the first and second metal gate electrodes at least partially conform to the pattern of the conductive layer and wherein widths of first surfaces of the first and second metal gate electrodes are different from respective widths of second surfaces of the first and second metal gate electrodes as a result of the pattern.

The first surfaces of the first and second metal gate electrodes may be above the second surfaces of the first and second metal gate electrodes, and the widths of the first surfaces may be greater than the widths of the second surfaces. The first layer may be an insulating layer.

The pattern may include a first section in a first direction, a second section in a second direction different from the first direction, and a third section in the second direction and spaced from the second section. Widths of the first and second surfaces of the first metal gate electrode may be greater than respective widths of the first and second surfaces of the second metal gate electrodes.

BRIEF DESCRIPTION OF THE DRAWINGS

Features will become apparent to those of skill in the art by describing in detail example embodiments with reference to the attached drawings in which.

DETAILED DESCRIPTION

Figure 1:
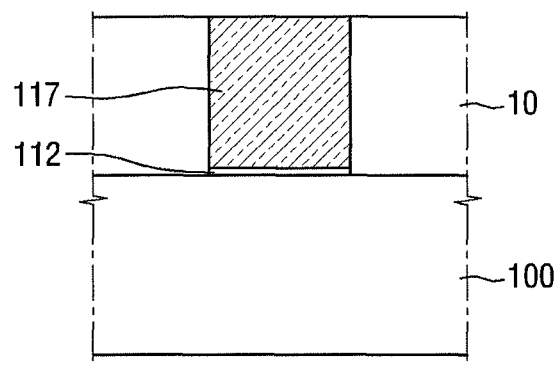
FIGS. 1-9 illustrate operations included in on embodiment of a method for making a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

FIGS. 1 to 9 illustrate operations included in one embodiment of a method for fabricating a semiconductor device. In FIGS. 1 to 9, it is understood that a source/drain region may be formed in a substrate, an isolation layer (e.g., a shallow trench isolation (STI)) may be formed, and/or a space on a side wall of a sacrificial gate may be formed in at least one example embodiment.

Referring to FIG. 1, a first dummy gate electrode 117 is formed on a substrate 100. A first dummy gate dielectric layer 112 is formed between the substrate and the first dummy gate electrode 117. The substrate 100 may be a bulk silicon or a silicon-on-insulator (SOI). For example, substrate 100 may be a silicon substrate or may contain other materials, for example, germanium, silicon germanium, indium antimonide, a lead telluride compound, indium arsenide, indium phosphide, gallium arsenide, and/or gallium antimonide.

Also, the substrate 100 may have a active pattern with a fin shape. Such a fin-type active pattern may include silicon or germanium that is an elemental semiconductor material. In another implementation, the fin-type active pattern may include a compound semiconductor and for example, a Group IV-IV compound semiconductor or a Group III-V compound semiconductor. An example of the Group IV-IV compound semiconductor may include a binary compound or ternary compound including at least two of carbon (C), silicon (Si), germanium (Ge), or tin (Sn), or a compound in which a Group IV element is doped in the above compound. An example of the Group III-V compound semiconductor may include one of a binary compound, a ternary compound, and a quaternary compound in which at least one of Group III elements such as aluminum (Al), gallium (Ga), or indium (In) is coupled to at least one Group V element such as phosphorous (P), arsenic (As), or antimony (Sb).

An example of the first dummy gate dielectric layer 112 may include one of a silicon oxide film ($SiO_2$), a silicon oxynitride film (SiON), or a combination thereof. The first dummy gate dielectric layer 112 may be formed using, for example, thermal treatment, chemical treatment, an atomic layer deposition (ALD) method, or a chemical vapor deposition (CVD) method.

The first dummy gate electrode 117 may include silicon. In one embodiment, the first dummy gate electrode 117 may include one of poly silicon (poly Si), amorphous silicon (a-Si), or a combination thereof. The first dummy gate electrode 117 may not be doped with an impurity or doped with similar impurities.

After forming the first dummy gate dielectric layer 112 and first dummy gate electrode 117, a source/drain region is formed on respective sides of the first dummy gate electrode 117.

Next, an interlayer insulating layer 10 that covers the first dummy gate electrode 117 is formed on the substrate 100. The interlayer insulating layer 10 may include at least one of a material having a low dielectric constant, an oxide film, a nitride film, or an oxynitride film. Examples of a material having a low dielectric constant include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PRTEOS), fluoride silicate glass (FSG), high density plasma (HDP), plasma enhanced oxide (PEOX), flowable CVD (FCVD), or a combination thereof.

Next, the interlayer insulating layer 10 is planarized to expose a top surface of the first dummy gate electrode 117. The planarizing process may be, for example, a chemical mechanical polishing (CMP) process.

Figure 2:
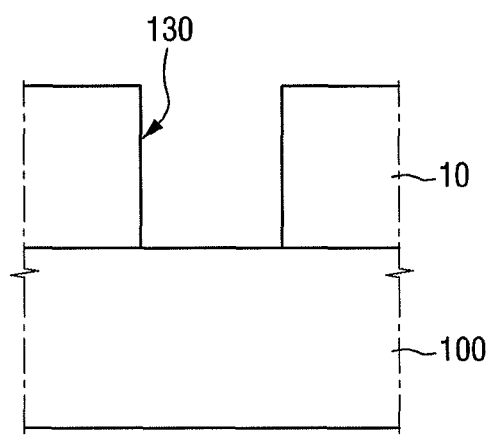

Referring to FIG. 2, the first dummy gate electrode 117 is removed. After removing the first dummy gate electrode 117, the first dummy gate dielectric layer 112 is removed to form a first trench 130. A top surface of the substrate 100 may be exposed by the first trench 130. Thus, the interlayer insulating layer 10 including the first trench 130 is formed on the substrate 100.

The first dummy gate electrode 117 may be removed using, for example, a wet process or a dry process. In an example of a wet etching process, the first dummy gate electrode 117 is exposed to an aqueous solution containing a hydroxide source for a predetermined time and temperature, so that first dummy gate electrode 117 is substantially removed. The hydroxide source may include, for example, ammonium hydroxide, tetraalkyl ammonium hydroxide, or tetramethyl ammonium hydroxide (TMAH).

The first dummy gate dielectric layer 112 may be removed by a wet etching method, dry etching method, or a combination thereof. The etching solution or etching gas may vary depending, for example, on the material of the first dummy gate dielectric layer 112.

Figure 3:
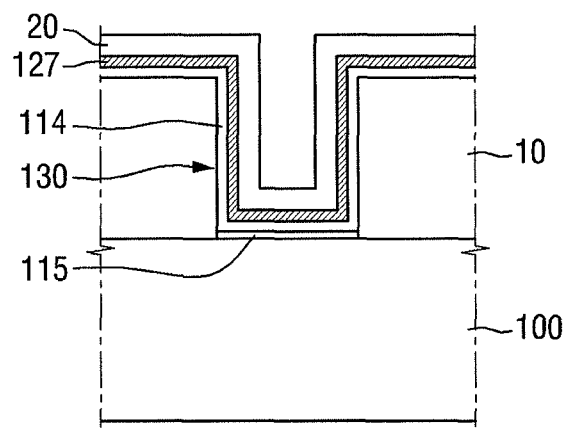

Referring to FIG. 3, a first interfacial layer 115 is formed on a bottom surface of the first trench 130. The first interfacial layer 115 may include, for example, a silicon oxide film. The first interfacial layer 115 may be formed using, for example, a chemical oxidation method, an ultraviolet oxidation method, or a dual plasma oxidation method.

Next, a first dielectric layer 114 is conformally formed on the top surface of the interlayer insulating layer 10 and a side and the bottom surface of the first trench 130. The first dielectric layer 114 is formed on the first interfacial layer 115. The first dielectric layer 114 may be formed using, for example, a chemical vapor deposition method (CVD), or an atomic layer deposition (ALD) method.

The first dielectric layer 114 may include a dielectric layer having a high dielectric constant. Examples include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Next, a first lower conductive layer 127 is formed on the first dielectric layer 114. The first lower conductive layer 127 may be conformally formed along the first dielectric layer 114 using, for example, a chemical vapor deposition method (CVD) or an atomic layer deposition (ALD) method. The first lower conductive layer 127 may include, for example, a TiN film.

Next, a capping layer 20 is formed on the first lower conductive layer 127. After forming the capping layer 20, an annealing process may be performed. The capping layer 20 may include amorphous silicon, poly silicon, or a combination thereof. During the annealing process, the capping layer 20 may prevent a thickness of the first interfacial layer 115 from being increased. After the annealing process, the capping layer 20 is removed to expose the lower conductive layer 127.

Figure 4:
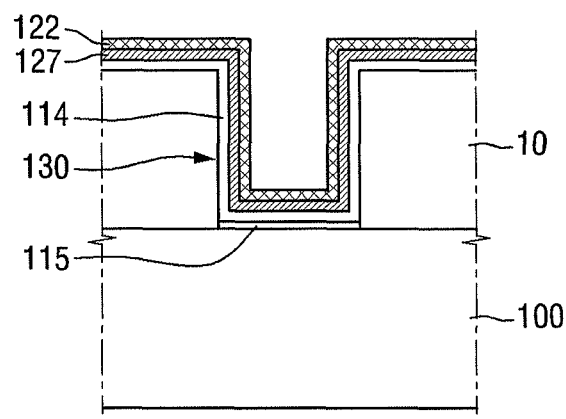

Referring to FIG. 4, a first conductive layer 122 is formed along the side and bottom surfaces of the first trench 130. The first conductive layer 122 is formed along the top surface of the interlayer insulating layer 10 and the side and bottom surfaces of the first trench 130. The first conductive layer 122 may be conformally formed along the first lower conductive layer 127.

The first conductive layer 122 may be a p-type work function regulating layer. The first conductive layer 122 may include at least one of TiN or TaN. For example, the first conductive layer 122 may include a TiN film or a TaN film. In an implementation, the first conductive layer 122 may include a double layer formed of a TaN film and a TiN film.

Figure 5:
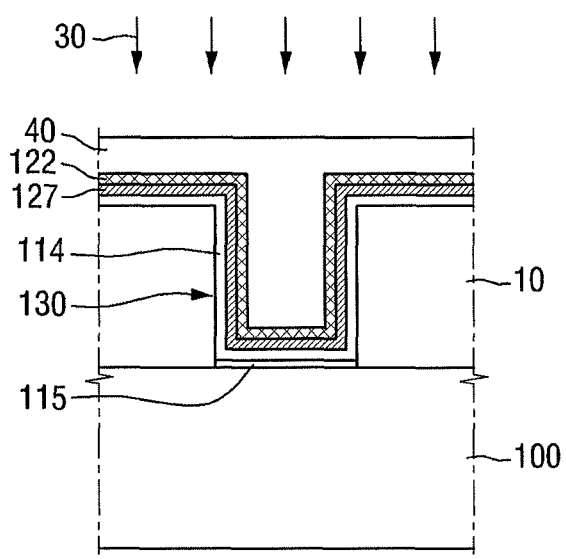

Referring to FIG. 5, a pre-mask film 40 that fills the first trench 130 is formed on the first conductive layer 122. The pre-mask film 40 may be formed on a top surface of the interlayer insulating layer 10. The pre-mask film 40 may be a developable bottom anti-reflective coating (dBARC) film. The pre-mask film 40 may include a material having an excellent gap-fill property to fill the first trench 130. The pre-mask film 40 that fills the first trench 130 may be formed, for example, to directly contact the first conductive layer 122.

Next, the pre-mask film 40 is thermally treated by a first annealing process 30. The first annealing process 30 may be a bake process. The first annealing process 30 may be performed at a first temperature, which, for example, may be between 150° C. and 190° C.

The thermally treated pre-mask film 40 may be a dBARC film. However, an etch rate of the pre-mask film 40 may be adjusted in an etching process that will be subsequently performed by the first annealing process 30. The etch rate of the pre-mask film 40 may be varied in an etching process to be subsequently performed in accordance with a progressive temperature of the first annealing process 30.

In an alternative embodiment, an annealing process may not be performed on the pre-mask film 40. When an annealing process is not performed on the pre-mask film 40, it may be experimentally hard to determine an etch rate of the pre-mask film 40. However, when the pre-mask film 40 is thermally treated by the first annealing process 30, an etching degree of the pre-mask film 40 may be adjusted by an etching time in the etching process to be subsequently performed.

Figure 6:
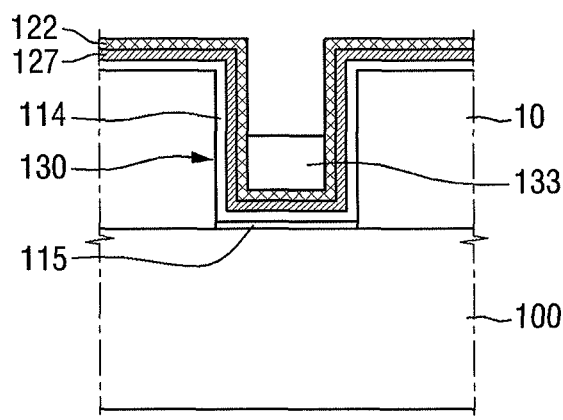

Referring to FIG. 6, the thermally treated pre-mask film 40 is etched to form a first pre-mask pattern 133 that fills part of the first trench 130. The first pre-mask pattern 133 is formed on the first conductive layer 122. In one embodiment, a distance between the substrate 100 and a top surface of the first pre-mask pattern 133 may be smaller than a thickness of the interlayer insulating layer 10. Further, the first pre-mask pattern 133 may be a dBARC pattern.

The first pre-mask pattern 133 may be formed through an etch-back process. A wet etch-back process may be used. Thus, a part of the pre-mask film 40 that fills the first trench 130 is removed using the wet etch-back process to form the first pre-mask pattern 133. An etchant that is used for the wet etch-back process may be a developer.

The first pre-mask pattern 133 fills the part of the first trench 130, so that part of the first conductive layer 122 formed at the side of the first trench is exposed. The first conductive layer 122 formed on the top surface of the interlayer insulating layer 10 is exposed. Further, in the first conductive layer 122 formed at the side of the first trench 130, a portion of the first conductive layer 122 that is not in contact with the first pre-mask pattern 133 is exposed.

Figure 7:
Figure 7:
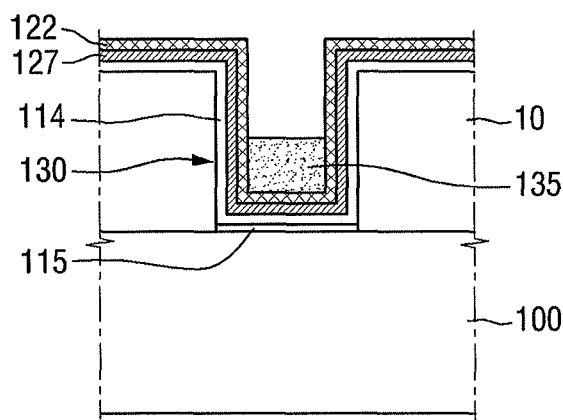

Referring to FIG. 7, the first pre-mask pattern 133 is changed into a first mask pattern 135 by a second annealing process 35. The first pre-mask pattern 133 may be cross-linked by the second annealing process 35. By doing this, the first pre-mask pattern 133 may be changed into the first mask pattern 135. Thus, the first pre-mask pattern 133 may be the dBARC pattern, and the first mask pattern 135 that is changed from the first pre-mask pattern 133 by the second annealing process 35 may be a bottom anti-reflective coating (BARC) pattern.

The second annealing process 35 may be, for example, a bake process. The second annealing process 35 may be performed at a second temperature, which, for example, may be 220° C. or higher. According to the present embodiment, the second annealing process 35 is performed at a temperature higher than the first temperature of the first annealing process 30. Thus, the second annealing process 35 is performed at a higher temperature than that of the first annealing process 30.

When the first pre-mask pattern 133 that is a dBARC pattern is changed into the first mask pattern 135 that is a BARC pattern, an adhesive strength between the first mask pattern 135 and the first conductive layer 122 may be increased. In a subsequent process that removes part of the first conductive layer 122, the increased adhesive strength between the first mask pattern 135 and first conductive layer 122 may help prevent the first mask pattern 135 from being peeled off. Thus, the first mask pattern 135 and first conductive layer 122 may be strongly adhered, which may help prevent an etchant of a subsequent etching process from permeating between the first mask pattern 135 and first conductive layer 122.

Figure 8:
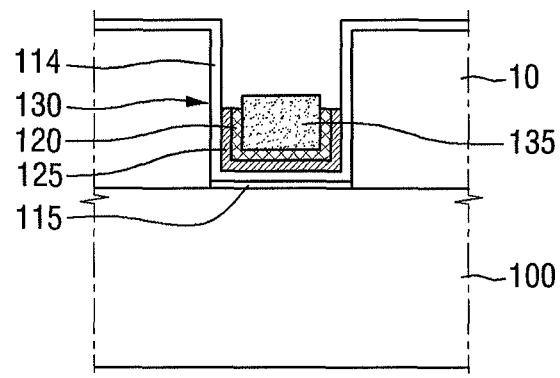

Referring to FIG. 8, the first conductive layer 122 exposed by the first mask pattern 135 is removed to form a first conductive layer pattern 120. The first conductive layer pattern 120 is formed along the bottom surface and part of side of the first trench 130.

A part of the first conductive layer 122 formed on the top surface of the interlayer insulating layer 10 and the first conductive layer 122 formed on the side of the first trench 130 is removed using the first mask pattern 135 as a mask. When the first conductive layer pattern 120 is formed, part of the first lower conductive layer 127 is removed to form a first lower conductive layer pattern 125. The first conductive layer 122 and the first lower conductive layer 127 formed on the top surface of the interlayer insulating layer 10 and the upper portion of the side of the first trench 130 are removed to expose part of the first dielectric layer 114.

The first conductive layer pattern 120 may be formed, for example, by a wet etching process. An etchant used for the wet etching process may include hydrogen peroxide ($H_2O_2$), and may be, for example, a standard cleaning 1 (SC1) solution.

Next, the first mask pattern 135 is removed to entirely expose the first conductive layer pattern 120. The first mask pattern 135 may be removed using, for example, a gas mixture including nitrogen and hydrogen.

The first conductive layer pattern 120 may be formed by a wet etching process, so that the first conductive layer pattern 120 may be formed on a part of the bottom surface and the side of the first trench 130 without damage. When the first conductive layer pattern 120 is formed without damage, reliability of the semiconductor device may be improved.

Figure 9:
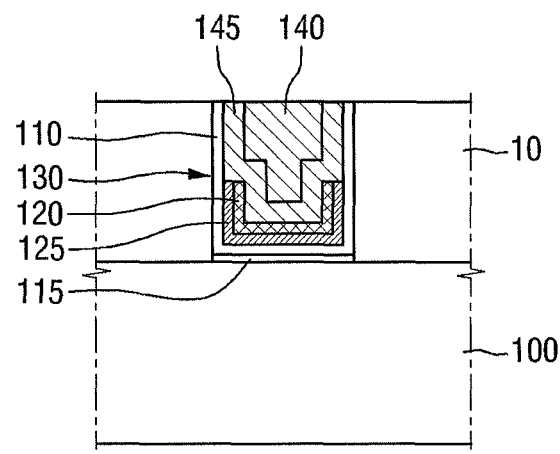

Referring to FIG. 9, first metal gate electrodes 140 and 145 are formed to fill the first trench 130 in which the first lower conductive layer pattern 125 and the first conductive layer pattern 120 are formed. The first metal gate electrodes 140 and 145 include a first lower metal gate electrode 145 and a first upper metal gate electrode 140.

The lower metal gate layer and the upper metal gate layer are sequentially formed on the first conductive layer pattern 120 and the first lower conductive layer pattern 125, so as to sufficiently fill the first trench 130. The upper metal gate layer, lower metal gate layer, and first dielectric layer 114 are planarized to expose a top surface of the interlayer insulating layer 10.

By the planarizing process, the first gate dielectric layer 110, first lower metal gate electrode 145, and first upper metal gate electrode 140 are formed in the first trench 130. The first lower metal gate electrode 145 may be conformally formed along the side and bottom surfaces of the first trench 130, in which the first conductive layer pattern 120 and the first lower conductive layer pattern 125 are formed.

The first metal gate electrodes 140 and 145 may have one of a structure in which a TiAl film, a TiN film, and an Al film are sequentially laminated, a structure in which a TiN film, a TiAl film, a TiN film, and an Al film are sequentially laminated, a structure in which a TiAl film, a TiN film, a TI film, and an Al film are sequentially laminated, or a structure in which a TiN film, a TiAl film, a TiN film, a TI film, and an Al film are sequentially laminated. Further, the first metal gate electrodes 140 and 145 may have one of a structure in which a TiN film, a TiAlC film, a TiN film, and a W film are sequentially laminated, or a structure in which a TiN film, a TiAl film, a TiN film, and a W film are sequentially laminated.

In the present method embodiment, the first conductive layer pattern 120 and the first lower conductive layer pattern 125 are formed along part of the bottom surface and the side surface of the first trench 130. As a result, the widths of upper portions of the first metal gate electrodes 140 and 145 are larger than widths of lower portions of the first metal gate electrodes 140 and 145, respectively. Thus, when the first metal gate electrodes 140 and 145 are formed and the width of the open first trench 130 is large, the first metal gate electrodes 140 and 145 may fill the first trench 130 without having an empty space or void. This may allow a resistance of the first metal gate electrodes 140 and 145 to be reduced, thereby improving performance of the semiconductor device.

FIGS. 10 to 14 illustrate operations included in another embodiment of a method for fabricating a semiconductor device. For convenience of description, operations different from the foregoing embodiment will be mainly described.

Figure 10:
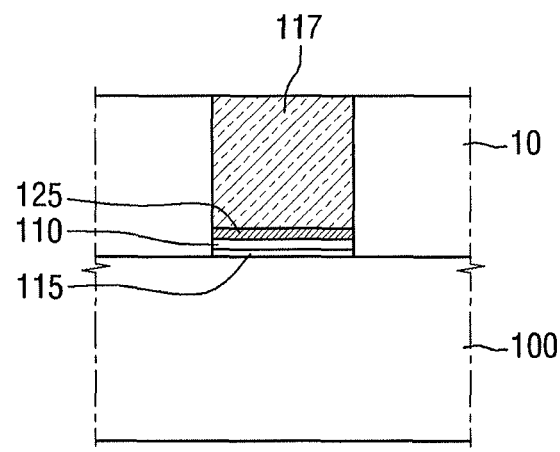
FIGS. 10-14 illustrate operations included in another embodiment of a method for making a semiconductor device.

Referring to FIG. 10, a first dummy gate electrode 117 is formed on a substrate 100. In contrast to FIG. 1, a first interfacial layer 115 and a first gate dielectric layer 110 are interposed between the first dummy gate electrode 117 and the substrate 100. Further, a first lower conductive layer pattern 125 may be interposed between the first dummy gate electrode 117 and the first gate dielectric layer 110.

The first dummy gate electrode 117 may include one of a poly silicon (poly-Si), or amorphous silicon (a-SI), or a combination thereof. In one embodiment, the first dummy gate electrode 117 may serve as the capping layer 20 that has been described with reference to FIG. 3.

A pre-interfacial layer, a dielectric layer, a lower conductive layer, and the capping layer are formed on the substrate 100. After forming the dummy gate layer, an annealing process may be performed. The interfacial layer may include a silicon oxide film formed by a chemical oxidation method, an ultraviolet oxidation method, or a dual plasma oxidation method. The dielectric layer may include an insulating layer having a high dielectric constant. The lower conductive layer may include a TiN film.

After performing the annealing process, the pre-interfacial layer, a dielectric layer, a lower conductive layer, and the capping layer are patterned. By the patterning process, the first interfacial layer 115, first gate dielectric layer 110, first lower conductive layer pattern 125, and first dummy gate electrode 117 are sequentially formed.

In the present method embodiment, the capping layer is patterned to form the first dummy gate electrode 117. After performing the annealing process, the capping layer is removed and a dummy gate layer may be additionally formed. Next, the dummy gate layer is patterned to form the first dummy gate electrode 117.

Figure 11:
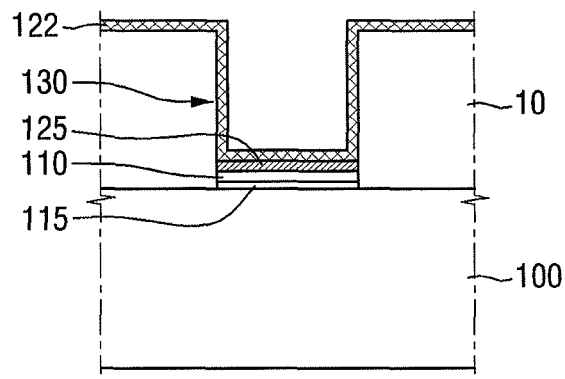

Referring to FIG. 11, the first dummy gate electrode 117 is removed to form the first trench 130. The first trench 130 exposes the first lower conductive layer pattern 125.

Next, the first conductive layer 122 is formed along the side and bottom surfaces of the first trench 130. Thus, the first conductive layer 122 is formed on the top surface of the interlayer insulating layer 10, the side surface of the first trench 130, and the top surface of the first gate dielectric layer 110. The first conductive layer 122 is formed on the top surface of the first lower conductive layer pattern 125.

Figure 12:
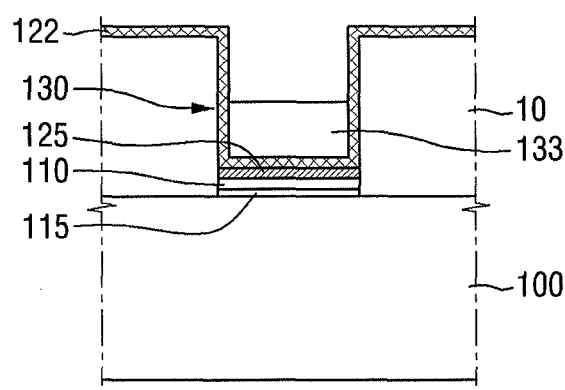

Referring to FIG. 12, the first pre-mask pattern 133 that fills part of the first trench 130 is formed on the first conductive layer 122. As described with reference to FIGS. 5 and 6, after forming pre-mask film 40 that fills the first trench 130, the pre-mask film 40 may be thermally treated by the first annealing process 30. Next, the thermally treated pre-mask film 40 is wet-etched back to form the first pre-mask pattern 133 that fills part of first trench 130.

Figure 13:
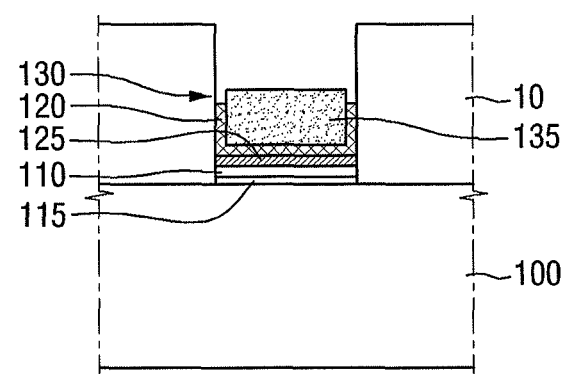

Referring to FIG. 13, the first pre-mask pattern 133 is thermally treated to change the first pre-mask pattern 133 into the first mask pattern 135.

Next, the first conductive layer 122 exposed by the first mask pattern 135 is removed to form the first conductive layer pattern 120. The first conductive layer pattern 120 is formed along a part of the bottom surface and the side of the first trench 130. Next, the first mask pattern 135 is removed to entirely expose the first conductive layer pattern 120.

Figure 14:
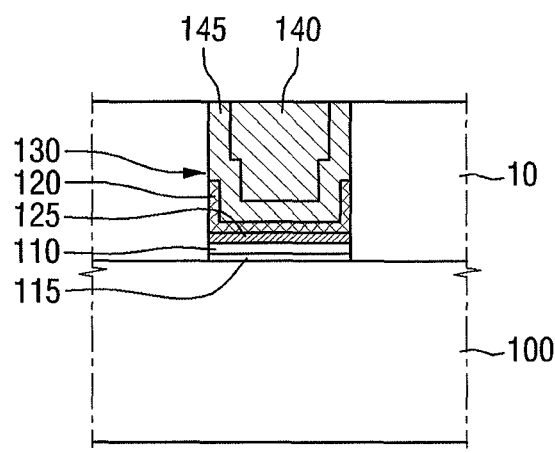

Referring to FIG. 14, the first metal gate electrodes 140 and 145 are formed to fill the first trench 130 in which the first conductive layer pattern 120 is formed. In the first trench 130 in which the first interfacial layer 115, first gate dielectric layer 110, and first lower conductive layer pattern 125 are sequentially formed, the first conductive layer pattern 120 is formed along part of the bottom and side surfaces of the first trench 130. The first lower metal gate electrode 145 is formed along the side and bottom surfaces of the first trench 130 in which the first conductive layer pattern 120 is formed. The first upper metal gate electrode 140 is formed on the first lower metal gate electrode 145.

FIGS. 15 to 19 illustrate operations included in another embodiment of a method for fabricating a semiconductor. For convenience of description, operations different from the initial embodiment will be mainly described.

Figure 15:
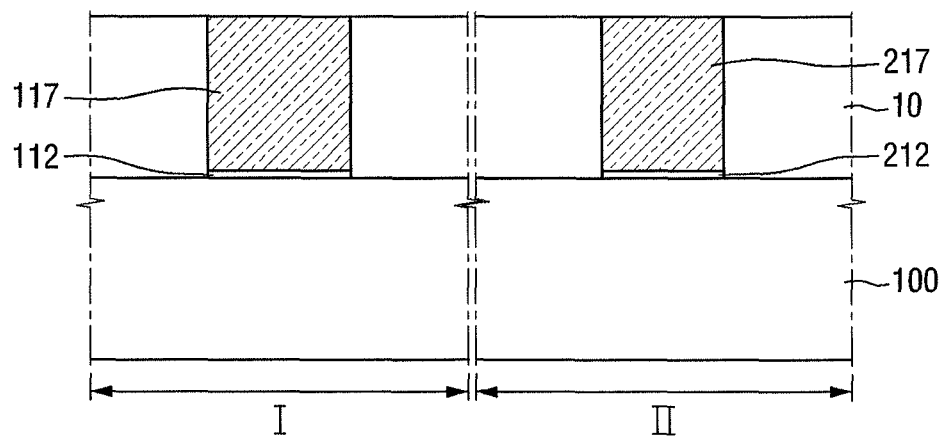
FIGS. 15-19 illustrate operations included in another embodiment of a method for making a semiconductor device.

Referring to FIG. 15, substrate 100 includes a first region I and a second region II. The first region I includes the first dummy gate dielectric layer 112 and the first dummy gate electrode 117. The second region II includes a second dummy gate dielectric layer 212 and a second dummy gate electrode 217.

The first and second regions I and II may be separated from each other or connected to each other. In the present method embodiment, PMOS material may be formed in the first region I and second region II. Also, in the present embodiment, a gate length of the PMOS material that is formed in the first region is different from a gate length of the PMOS that is formed in the second region II.

Next, the interlayer insulating layer 10 that covers the first dummy gate electrode 117 and second dummy gate electrode 217 is formed on the substrate 100. The interlayer insulating layer 10 is planarized to expose the top surfaces of the first dummy gate electrode 117 and the second dummy gate electrode 217.

Figure 16:
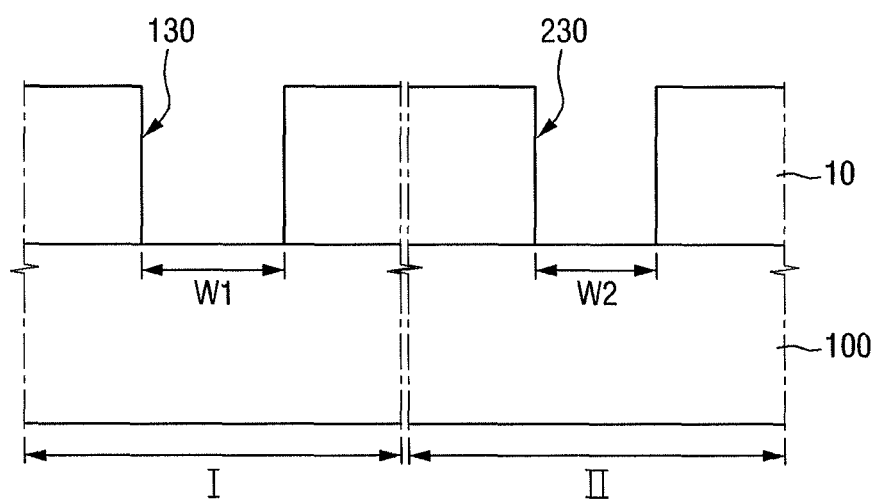

Referring to FIG. 16, the first dummy gate electrode 117 and the first dummy gate dielectric layer 112 are removed to form a first trench 130 in the first region I. Further, the second dummy gate electrode 217 and the second dummy gate dielectric layer 212 are removed to form a second trench 230 in the second region II.

The width of the first trench 130 may be a first width w1 and the width of the second trench 230 may be second width w2. In one embodiment, the first width w1 and the second width w2 are different from each other. Accordingly, the interlayer insulating layer 10 includes the first trench 130 and the second trench 230 having different widths. FIG. 16 illustrates that the first trench 130 and the second trench 230 expose the substrate 100. In other implementations, the substrate may not be exposed.

Figure 17:
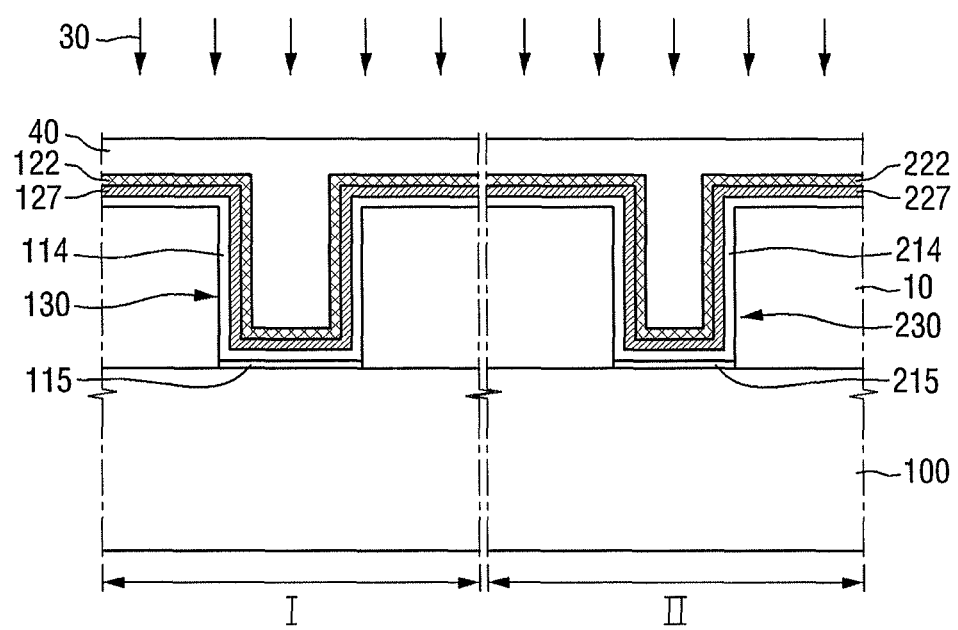

Referring to FIG. 17, the first interfacial layer 115 and a second interfacial layer 215 are formed on the bottom surfaces of the first trench 130 and the second trench 230, respectively. Next, a first dielectric layer 114 and a first lower conductive layer 127 are sequentially formed on the side and bottom surfaces of the first trench 130. A second dielectric layer 214 and a second lower conductive layer 227 are sequentially formed on side and bottom surfaces of the second trench 230. The first dielectric layer 114 and the second dielectric layer 214 may include the same material and the first lower conductive layer 127 and the second lower conductive layer 227 may include the same material.

After forming the first lower conductive layer 127 and second lower conductive layer 227, an annealing process may be performed.

Next, the first conductive layer 122 is formed along the side and bottom surfaces of the first trench 130. A second conductive layer 222 is formed along the side and bottom surfaces of the second trench 230. The first conductive layer 122 and the second conductive layer 222 may be simultaneously formed along the top surface of the interlayer insulating layer 10, the side and bottom surfaces of the first trench 130, and the side and bottom surfaces of the second trench 230. The first conductive layer 122 and the second conductive layer 222 may be conformally formed along the first lower conductive layer 127 and the second lower conductive layer 227, respectively.

Next, the pre-mask film 40 that fills first trench 130 and second trench 230 is formed on the first conductive layer 122 and the second conductive layer 222. The pre-mask film 40 may be formed on the top surface of the interlayer insulating layer 10. Next, the pre-mask film 40 is thermally treated by the first annealing process 30. An etch rate of the pre-mask film 40 may be adjusted in an etching process (which will be subsequently performed) by the first annealing process 30.

Figure 18:
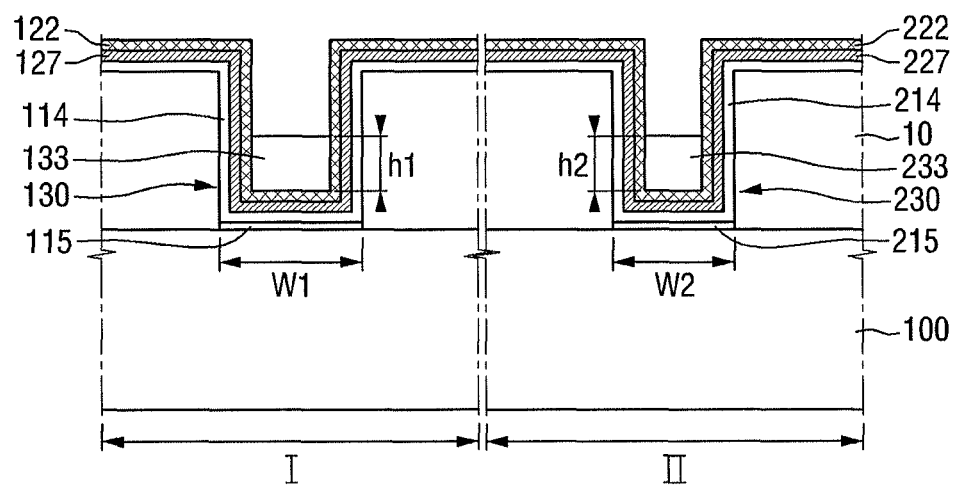

Referring to FIG. 18, the thermally treated pre-mask film 40 is etched to form a first pre-mask pattern 133 that fills part of the first trench 130 and a second pre-mask pattern 233 that fills part of the second trench 230. Parts of the first conductive layer 122 and the second conductive layer 222 that are formed on side surfaces of the first trench 130 and the second trench 230 are exposed by the first pre-mask pattern 133 and second pre-mask pattern 233. The first pre-mask pattern 133 and the second pre-mask pattern 233 may be formed through a wet etching process using a developer, that is, a wet etch back process.

In the present embodiment, a first thickness h1 of the first pre mask pattern 133 and a second thickness h2 of the second pre mask pattern 233 are equal to each other. In other words, the thicknesses may be the same in two compared locations except for minute differences in thickness that may be caused by a margin during processing.

The first pre-mask pattern 133 and the second pre-mask pattern 233 may be formed by a wet etching process, so that a loading effect caused by the difference in widths of the first trench 130 and the second trench 230 may be removed. Accordingly, the first pre-mask pattern 133 and the second pre-mask pattern 233 may have the same thickness.

Figure 19:
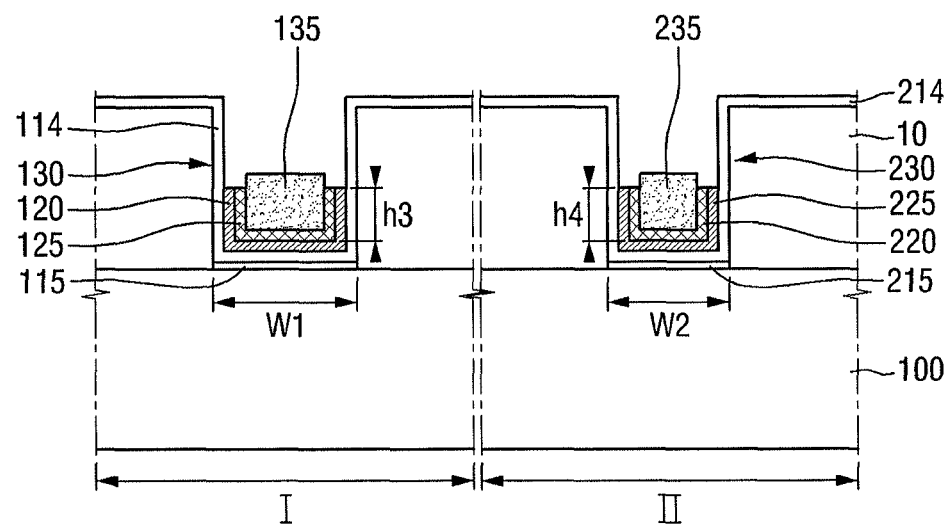

Referring to FIG. 19, through the second annealing process (35 in FIG. 7), the first pre-mask pattern 133 is changed into a first mask pattern 135 and the second pre-mask pattern 233 is changed into a second mask pattern 235.

Next, the first conductive layer 122 exposed by the first mask pattern 135 is removed to form a first conductive layer pattern 120. The second conductive layer 222 exposed by the second mask pattern 235 is removed to form a second conductive layer pattern 220. When the first conductive layer pattern 120 and second conductive layer pattern 220 are formed, the first lower conductive layer pattern 125 and the second lower conductive layer pattern 225 are formed in the first trench 130 and the second trench 230, respectively.

Through the wet etching process, the first conductive layer 122 and the second conductive layer 222 formed on the top surface of the interlayer insulating layer 10, an upper portion of the side surface of the first trench 130, and an upper portion of the side surface of the second trench 230 are removed to form the first conductive layer pattern 120 and the second conductive layer pattern 220.

In FIG. 19, the height of the first conductive layer pattern 120 that extends along the side of the first trench 130 is a third height h3. The height of the second conductive layer pattern 220 that extends along the side of the second trench 230 is a fourth height h4. In the present embodiment, heights h3 and height h4 are substantially equal.

In the present embodiment, the first conductive layer pattern 120 and the second conductive layer pattern 220 are formed by a wet etching process. Thus, a loading effect that may be caused by a difference in widths of the first trench 130 and second trench 230 may be avoided. The first conductive layer pattern 120 and the second conductive layer pattern 220 having the same height may be formed on the side surfaces of the first trench 130 and second trench 230 having different widths.

When the first conductive layer pattern 120 and second conductive layer pattern 220 serve as a work-function regulating layer, the work-function regulating layer having the same height may be formed in the gate electrodes of the transistors having different gate lengths. This may improve reliability of the semiconductor device.

After removing the first mask pattern 135 and second mask pattern 235, replacement metal gate electrodes that fill the first trench 130 and the second trench 230 are formed in the first trench 130 and the second trench 230, respectively.

Figure 20:
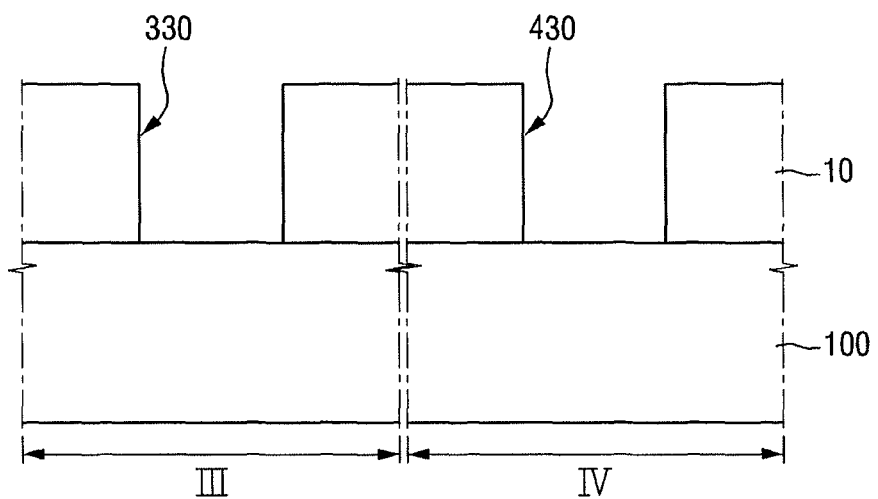
FIGS. 20-27 illustrate operations included in another embodiment of a method for making a semiconductor device.

FIGS. 20 to 27 illustrate operations included in another embodiment of a method for fabricating a semiconductor device. Referring to FIG. 20, the interlayer insulating layer 10 including a third trench 330 and a fourth trench 430 is formed on the substrate 100. The third trench 330 is formed in a third region III and the fourth trench 430 is formed in a fourth region IV. The third region III and fourth region IV may be separated or connected to each other. In the present embodiment, the third region III may be a PMOS forming region and the fourth region IV may be an NMOS forming region.

A third dummy gate dielectric layer and a third dummy gate electrode are formed in the third region III. A fourth dummy gate dielectric layer and a fourth dummy gate electrode are formed in the fourth region IV.

After forming an interlayer insulating layer 10 that covers the third dummy gate electrode and fourth dummy gate electrode on a substrate 100, the interlayer insulating layer 10 is planarized to expose top surfaces of the third dummy gate electrode and the fourth dummy gate electrode. Next, the third dummy gate electrode and third dummy gate dielectric layer are removed to form third trench 330. The fourth dummy gate electrode and the fourth dummy gate dielectric layer are removed to form fourth trench 430.

Figure 21:
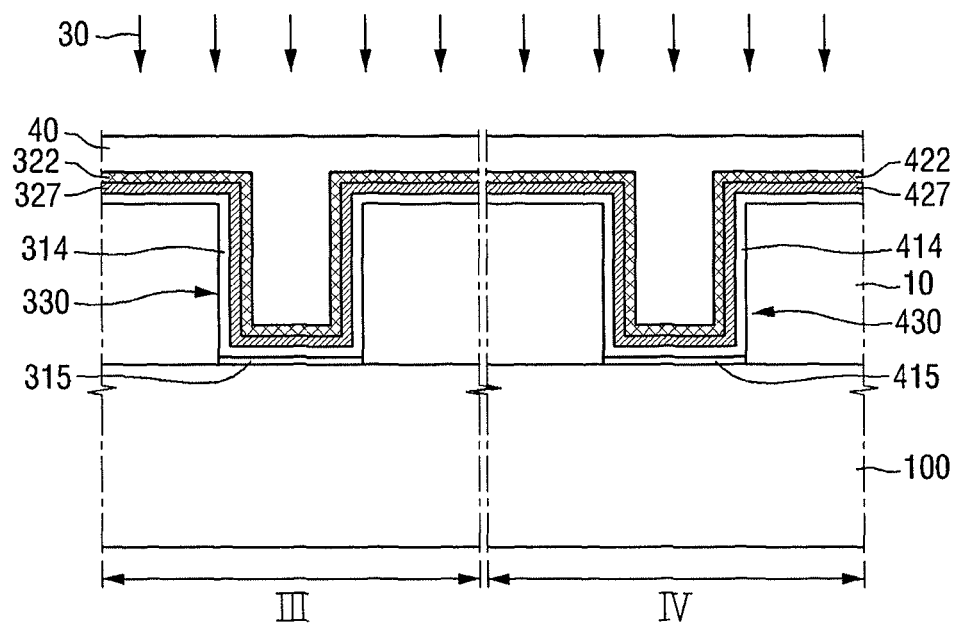

Referring to FIG. 21, a third interfacial layer 315 and a fourth interfacial layer 415 are formed on bottom surfaces of the third trench 330 and the fourth trench 430, respectively.

The third interfacial layer 315 and the fourth interfacial layer 415 may include, for example, a silicon oxide film.

A third dielectric layer 314 and a third lower conductive layer 327 are sequentially formed along a top surface of the interlayer insulating layer 10 and the side and bottom surfaces of the third trench 330. A fourth dielectric layer 414 and a fourth lower conductive layer 427 are sequentially formed along the top surface of the interlayer insulating layer 10 and the side and bottom surfaces of the fourth trench 430. The third dielectric layer 314 and the fourth dielectric layer 414 may include a dielectric layer having a high dielectric constant. The third lower conductive layer 327 and the fourth lower conductive layer 427 may include a TiN film.

After forming the third lower conductive layer 327 and the fourth lower conductive layer 427, the annealing process may be performed.

Next, a third conductive layer 322 is formed along the top surface of the interlayer insulating layer 10 and the side and bottom surfaces of the third trench 330. A fourth conductive layer 422 is formed along the top surface of the interlayer insulating layer 10 and the side and bottom surfaces of the fourth trench 430. The third conductive layer 322 and the fourth conductive layer 422 may be a p-type work function regulating layer and, for example, may include at least one of TiN or TaN.

Next, a pre-mask film 40 that fills the third trench 330 and the fourth trench 430 is formed on the third conductive layer 322 and the fourth conductive layer 422. The pre-mask film 40 may be a dBARC film. Next, the pre-mask film 40 is thermally treated by a first annealing process 30. The pre-mask film 40 may be still a dBARC film.

Figure 22:
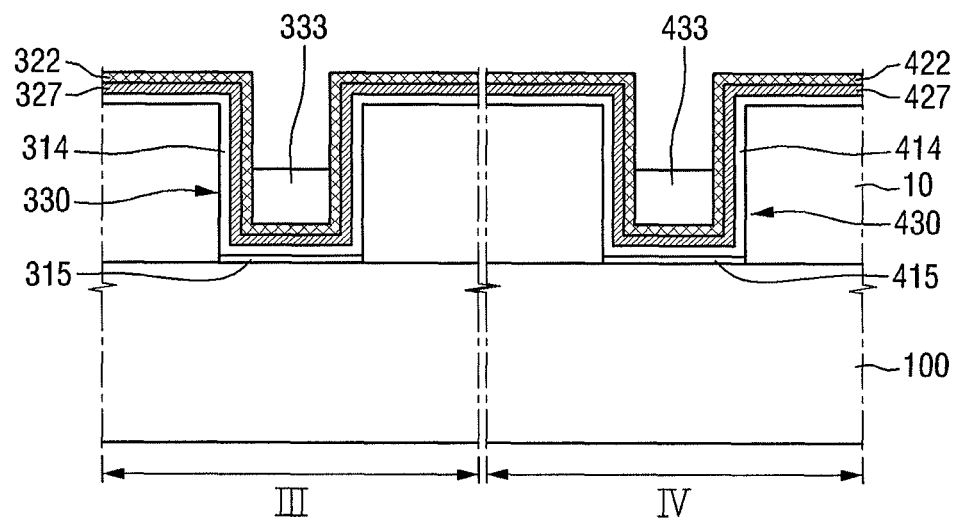

Referring to FIG. 22, a third pre-mask pattern 333 and a fourth pre-mask pattern 433, which fill parts of the third trench 330 and the fourth trench 430, respectively, are formed on the third conductive layer 322 and the fourth conductive layer 422, respectively.

The thermally treated pre-mask film 40 is wet-etched back to form the third pre-mask pattern 333 and the fourth pre-mask pattern 433 that fill parts of the third trench 330 and the fourth trench 430. The etchant used for the wet etch back process may be a developer. Part of the third conductive layer 322 formed on the side surface of the third trench 330, part of the fourth conductive layer 422 formed on the side surface of the fourth trench 430, and the third conductive layer 322 and the fourth conductive layer 422 formed on the top surface of the interlayer insulating layer 10 are exposed by the third pre-mask pattern 333 and the fourth pre-mask pattern 433.

The top surface of the third pre-mask pattern 333 and the top surface of the fourth pre-mask pattern 433 are closer to the substrate 100 than the top surface of the interlayer insulating layer 10. The third pre-mask pattern 333 and the fourth pre-mask pattern 433 may be a dBARC pattern.

Figure 23:
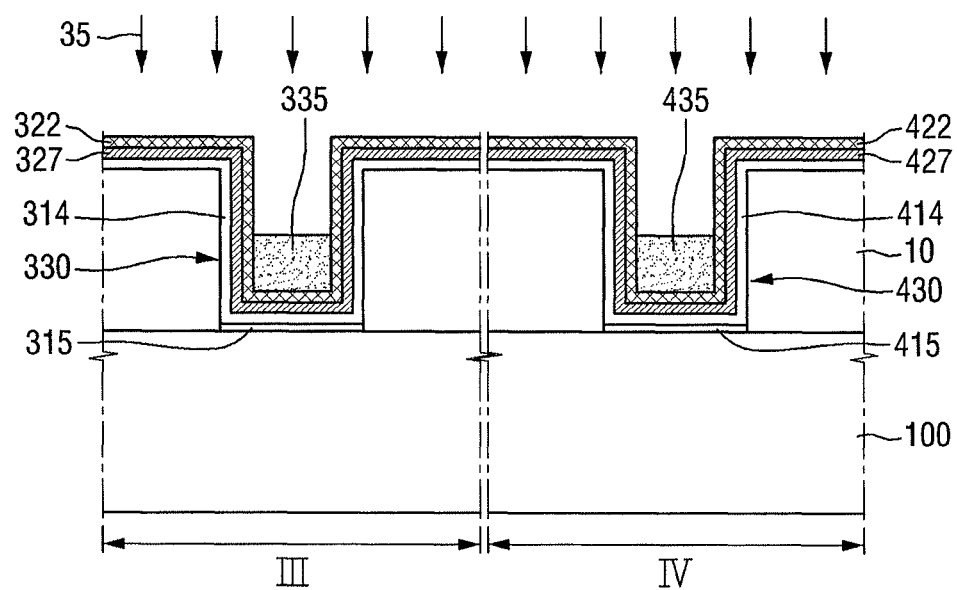

Referring to FIG. 23, through the second annealing process 35, the third pre-mask pattern 333 is changed into a third mask pattern 335 and the fourth pre-mask pattern 433 is changed into a fourth mask pattern 435. The third mask pattern 335 and the fourth mask pattern 435 changed by the second annealing process 35 may be a bottom anti-reflective coating (BARC) pattern.

Figure 24:
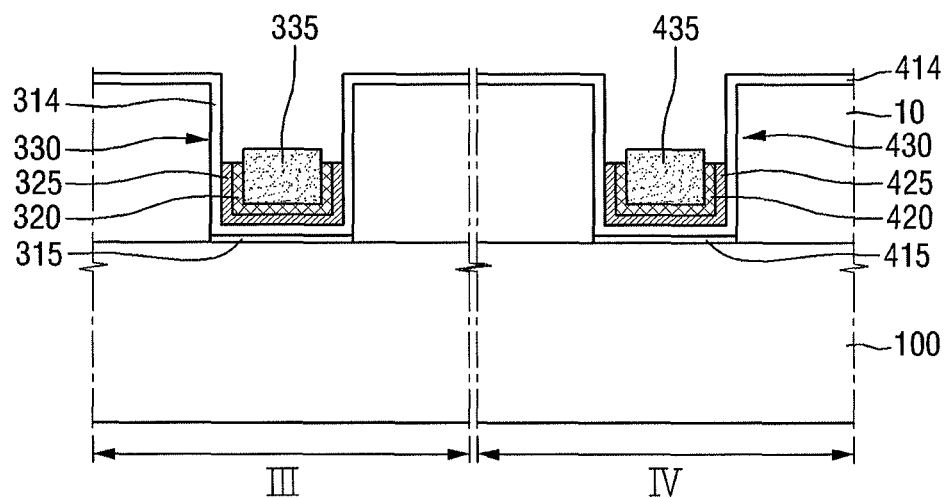

Referring to FIG. 24, the third conductive layer 322 exposed by the third mask pattern 335 is removed to form the third conductive layer pattern 320. The fourth conductive layer 422 exposed by the fourth mask pattern 435 is removed to form the fourth conductive layer pattern 420. The third conductive layer pattern 320 is formed along part of the bottom and side surfaces of the third trench 330. The fourth conductive layer pattern 420 is formed along part of the bottom and side surfaces of the fourth trench 430.

Part of the third conductive layer 322 formed on the top surface of the interlayer insulating layer 10, and the third conductive layer 322 formed on the side surface of the third trench 330, are removed using the third mask pattern 335 as a mask for a wet etching process. Further, part of the fourth conductive layer 422 formed on the top surface of the interlayer insulating layer 10, and the fourth conductive layer 422 formed on the side surface of the fourth trench 430, are removed using the fourth mask pattern 435 as a mask for a wet etching process. When the third conductive layer pattern 320 and the fourth conductive layer pattern 420 are formed, the third lower conductive layer pattern 325 and the fourth lower conductive layer pattern 425 may also be formed.

Thus, the third conductive layer pattern 320, fourth conductive layer pattern 420, third lower conductive layer pattern 325, and fourth lower conductive layer pattern 425 may be formed using a wet etching process.

Next, the third mask pattern 335 and the fourth mask pattern 435 are removed to entirely expose the third conductive layer pattern 320 and the fourth conductive layer pattern 420. The third mask pattern 335 and the fourth mask pattern 435 may be removed using, for example, a mixture of gas including nitrogen and hydrogen.

Figure 25:
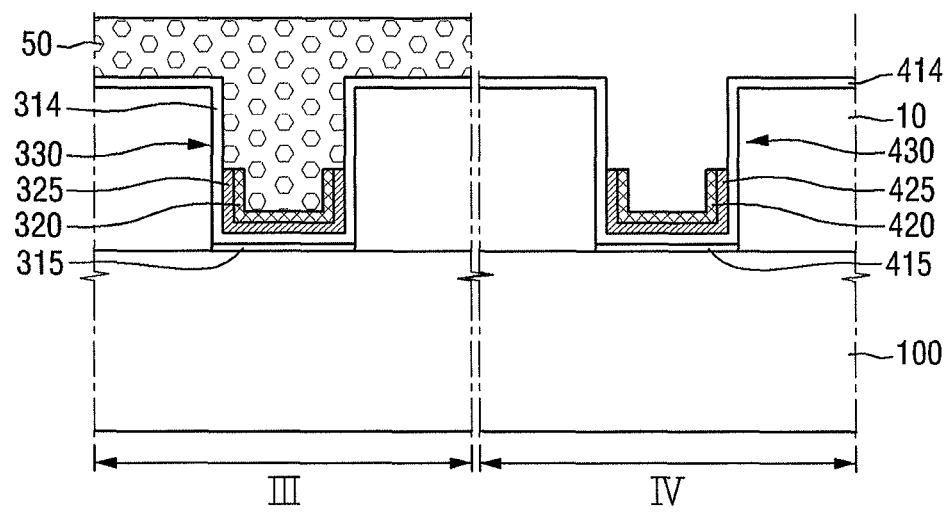

Referring to FIG. 25, a photosensitive layer pattern 50 is formed in the third region III. The photosensitive layer patter 50 may fill the third trench 330 to entirely cover the exposed third conductive layer pattern 320. The fourth lower conductive layer pattern 425 and fourth conductive layer pattern 420 formed in the fourth trench 430 are exposed by the photosensitive layer pattern 50.

Figure 26:
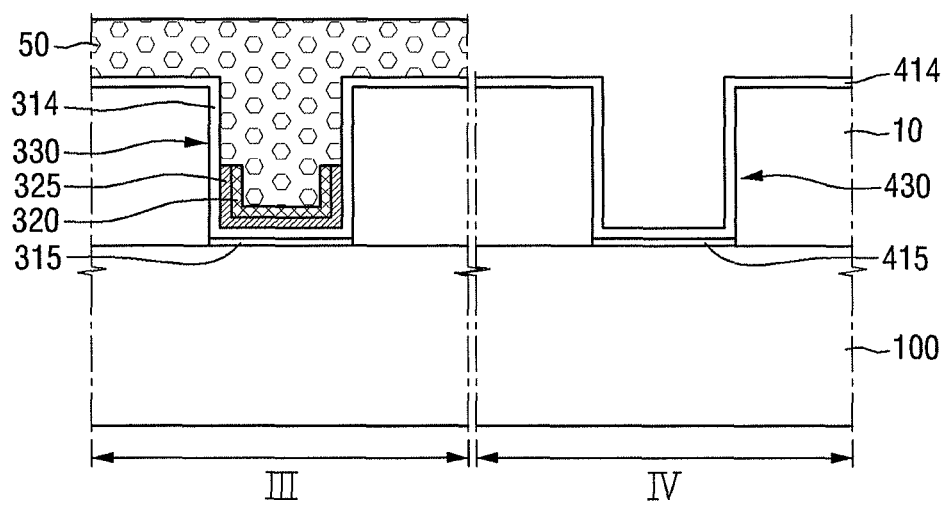

Referring to FIG. 26, the fourth lower conductive layer pattern 425 and the fourth conductive layer pattern 420 are removed using the photosensitive layer pattern 50 as a mask. By doing this, a fourth dielectric layer 414 that is formed on a bottom surface of the fourth trench 430 is exposed. The fourth conductive layer pattern 420 and the fourth lower conductive layer pattern 425 may be removed by a wet etching process. The etchant used for the wet etching process may include hydrogen peroxide ($H_2O_2$), and for example, a standard cleaning 1 (SC1) solution. Next, the photosensitive layer pattern 50 is removed to expose the third conductive layer pattern 320.

Figure 27:
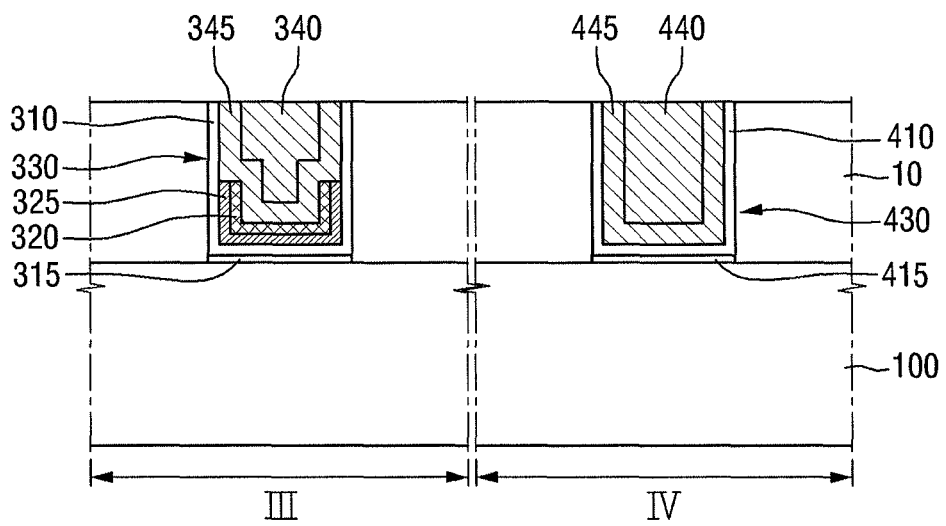

Referring to FIG. 27, third metal gate electrodes 340 and 345 are formed to fill the third trench 330 in which the third lower conductive layer pattern 325 and third conductive layer pattern 320 are formed. Further, fourth metal gate electrodes 440 and 445 are formed to fill the fourth trench 430.

The third metal gate electrodes 340 and 345 include a third lower metal gate electrode 345 and a third upper metal gate electrode 340. The fourth metal gate electrodes 440 and 445 include a fourth lower metal gate electrode 445 and a fourth upper metal gate electrode 440. The third lower metal gate electrode 345 and the fourth lower metal gate electrode 445 may be formed at the same level. The third upper metal gate electrode 340 and the fourth upper metal gate electrode 440 may be formed at the same level. Here, "the same level" means that the electrodes are formed by the same fabricating process.

The description of the third metal gate electrodes 340 and 345 and the fourth metal gate electrodes 440 and 445 is the same as the first metal gate electrodes 140 and 140 that have been described with reference to FIG. 9.

Figure 28:
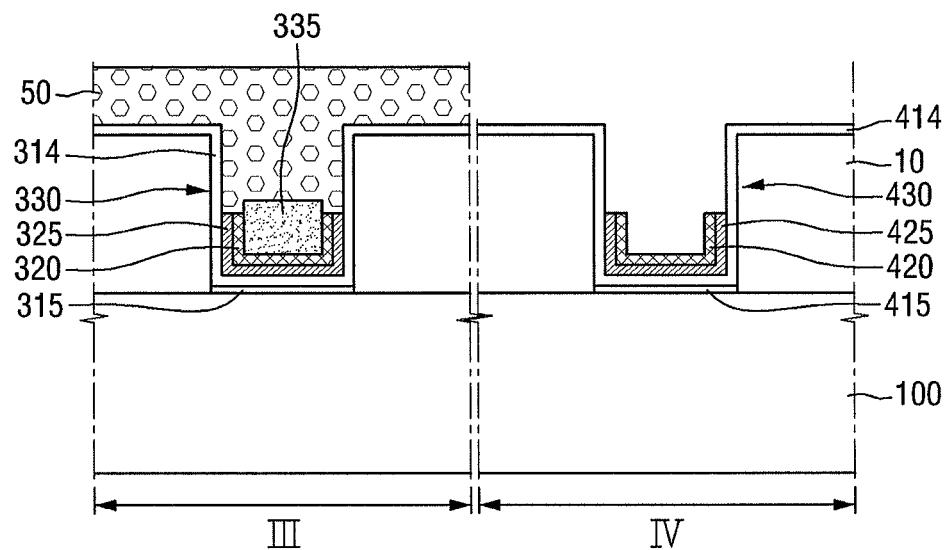
FIG. 28 illustrates an operation included in another embodiment of a method for making a semiconductor device.

FIG. 28 illustrates operations included in another embodiment of a method for fabricating a semiconductor device. For convenience of description, only operations different from those in the foregoing embodiment will be mainly described.

Referring to FIG. 28, after forming the third conductive layer pattern 320 and the fourth conductive layer pattern 420, the photosensitive layer pattern 50 that covers the third mask pattern 335 and the third conductive layer pattern 320 is formed in the third region III. The photosensitive layer pattern 50 fills the third trench 330.

Next, the fourth mask pattern 435 that fills a part of the fourth trench 430 is removed using the photosensitive layer pattern 50 as a mask. When the fourth mask pattern 435 is removed, the fourth conductive layer pattern 420 is entirely exposed.

Next, the fourth lower conductive layer pattern 425 and the fourth conductive layer pattern 420 are removed using the photosensitive layer pattern 50 as a mask. By doing this, the fourth dielectric layer 414 formed on the bottom surface of the fourth trench 430 is exposed. After removing the fourth lower conductive layer pattern 425 and the fourth conductive layer pattern 420, the photosensitive layer pattern 50 and the third mask pattern 335 are removed to expose the third conductive layer pattern 320.

Next, as illustrated in FIG. 27, the third metal gate electrodes 340 and 345 are formed to fill the third trench 330 in which the third lower conductive layer pattern 325 and the third conductive layer pattern 320 are formed. Further, the fourth metal gate electrodes 440 and 445 are formed so as to fill the fourth trench 430.

Figure 29:
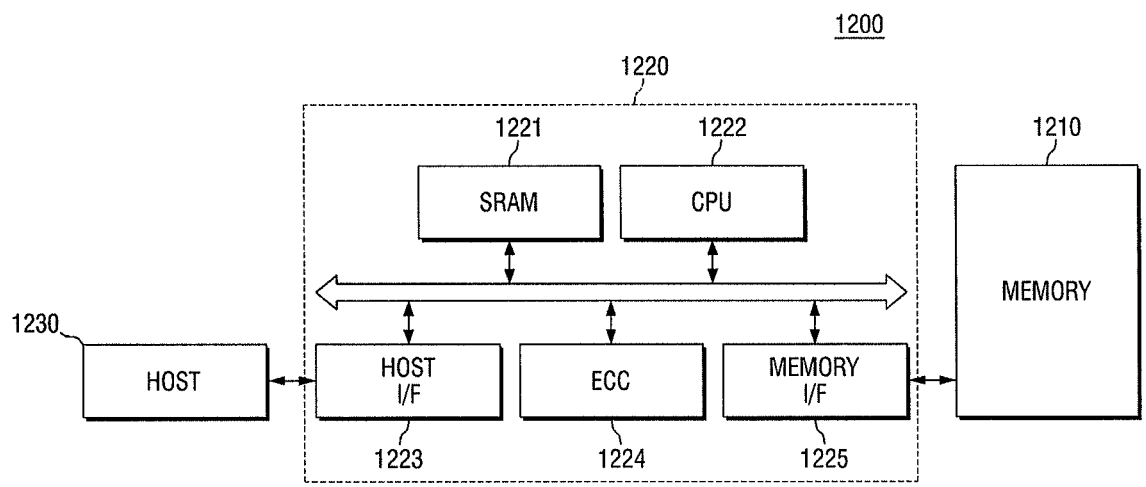
FIG. 29 illustrates an embodiment of a memory card including a semiconductor device made according to any of the aforementioned method embodiments.

FIG. 29 illustrates an embodiment of a memory card 1200 fabricated according to any of the aforementioned methods. Referring to FIG. 29, the memory card 1200 includes or may be coupled to a memory 1210, either or both of which may includes one or more of the semiconductor devices. The memory card 1200 may include a memory controller 1220 that controls exchange of data between a host 1230 and memory 1210. An SRAM 1221 may be used as an operating memory of a central processing device 1222. The host interface 1223 may include a protocol that allows the host 1230 to access the memory card 1200 to exchange data. An error correction code 1224 detects and corrects an error of data read from the memory 1210. A memory interface 1225 interfaces with the memory 1210. The central processing device 1222 performs overall control operation related to data exchange of the memory controller 1220.

Figure 30:
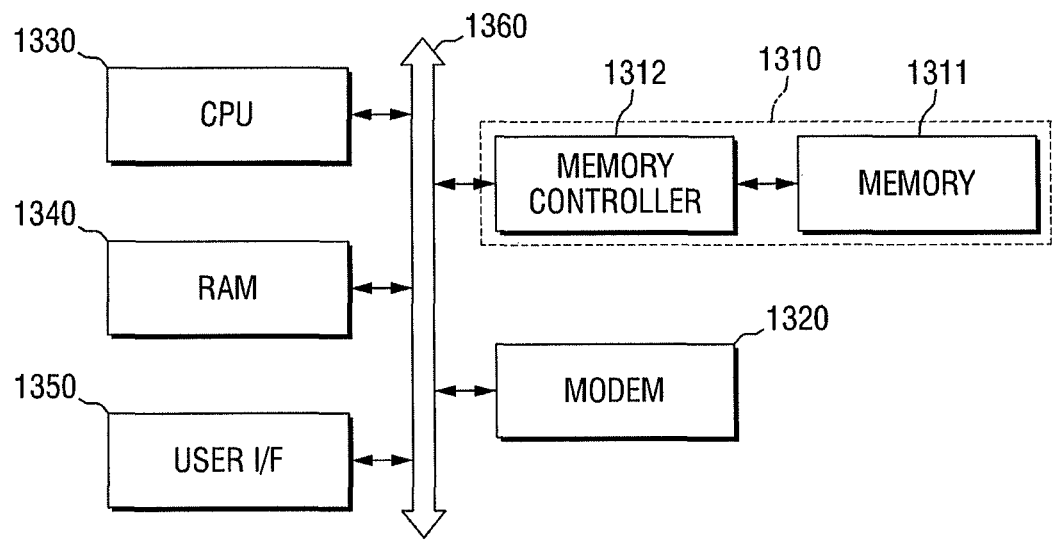
FIG. 30 illustrates an embodiment of an information processing system including a semiconductor device made according to any of the aforementioned method embodiments.

FIG. 30 illustrates an embodiment of an information processing system 1300 which includes a memory system 1310 having one or more semiconductor device fabricated in accordance with any of the aforementioned embodiments.

More specifically, the information processing system 1300 includes a memory system 1310, a modem 1320, a central processing device 1330, an RAM 1340, and a user interface 1350 electrically connected to a system bus 1360. The memory system 1310 includes a memory 1311 and a memory controller 1312, and may have substantially the same configuration as memory card 1200 in FIG. 29. The data processed by the central processing device 1330 or data received from an external device may be stored in the memory system 1310.

The information processing system 1300 may be applied to a memory card, an SSD, a camera image sensor, and other various chip sets. For example, memory system 1310 may be configured to adopt an SSD. In this case, the information processing system 1300 may stably and reliably process a large quantity of data.

Figure 31:
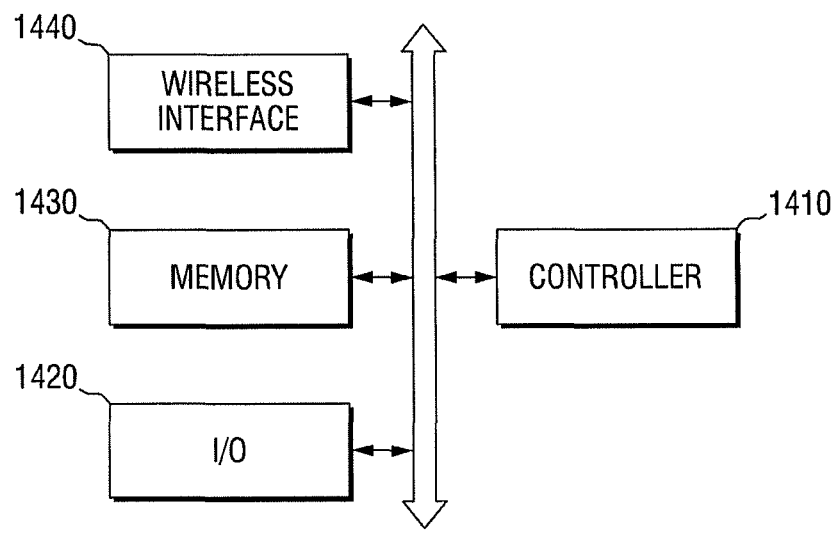
FIG. 31 illustrates an electronic apparatus including a semiconductor device made according to any of the aforementioned method embodiments.

FIG. 31 illustrates an embodiment of an electronic apparatus 1400 which may correspond to or be included in, for example, wireless communication equipment (e.g., a PDA, a notebook computer, a portable computer, a web tablet, a wireless phone and/or a wireless digital music player) or various equipment that exchanges information in a wireless communication environment.

The electronic apparatus 1400 may include a controller 1410, an input/output device 1420, a memory 1430, and a wireless interface 1440. The memory 1430 may include one or more semiconductor devices made according to any of the aforementioned embodiments. The controller 1410 may include a microprocessor, a digital signal processor, or a similar processor. The memory 1430 may be used to store a command (or user data) processed by the controller 1410. The wireless interface 1440 is used to exchange data through wireless data network. The wireless interface 1440 may include an antenna and/or a wireless transceiver. The electronic apparatus 1400 may use a third generation communication system protocol such as CDMA, GSM, NADC, E-TDMA, WCDMA, or CDMA2000.

By way of summation and review, the scale of a semiconductor device may be reduced in order to increase density. Also, in order to improve the characteristics of a semiconductor device, a metal gate may be used, for example, instead of a polysilicon gate. The metal gate may be fabricated using a replacement metal gate process. In the semiconductor device with a reduced scale, such a replacement metal gate process may include several etching, depositing, and polishing processes. As described above, embodiments may provide a method for fabricating a semiconductor device that may reduce a resistance of a replacement metal gate electrode to improve a characteristic of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A method for fabricating a semiconductor device, the method comprising:
    forming an interlayer insulating layer on a substrate, the interlayer insulating layer including a first trench;
    forming a first conductive layer along side and bottom surfaces of the first trench;
    forming a first pre-mask pattern on the first conductive layer, the first pre-mask pattern filling a part of the first trench;
    changing the first pre-mask pattern into a first mask pattern through a first bake process; and
    removing the first conductive layer exposed by the first mask pattern to form a first conductive layer pattern.

2. The method as claimed in claim 1, wherein:
    the first pre-mask pattern is a developable bottom anti-reflective coating (dBARC) pattern, and
    the first mask pattern is a bottom anti-reflective coating (BARC) pattern.

3. The method as claimed in claim 1, wherein forming of the first pre-mask pattern includes:
    forming a pre-mask film on the first conductive layer, the pre-mask film filling the first trench;
    thermally treating the pre-mask film through a second bake process; and
    etching-back the thermally treated pre-mask film to expose a part of the first conductive layer on the side of the first trench.

4. The method as claimed in claim 3, wherein forming of the first pre-mask film includes removing part of the pre-mask film filling the first trench using a wet etch back process.

5. The method as claimed in claim 3, wherein the first bake process is performed at a temperature greater than the second bake process.

6. The method as claimed in claim 1, wherein forming of the first conductive layer pattern includes removing part of the first conductive layer exposed by the first mask pattern using a wet etching.

7. The method as claimed in claim 1, wherein the first conductive layer includes at least one of TaN or TiN.

8. The method as claimed in claim 1, wherein:
    the interlayer insulating layer includes a second trench that has a width different from that of the first trench, the method further comprising:
    forming a second conductive layer along side and bottom surfaces of the second trench;
    forming a second pre-mask pattern on the second conductive layer, the second pre-mask pattern filling part of the second trench and having substantially a same thickness as the first pre-mask pattern;
    changing the second pre-mask pattern into a second mask pattern through the first bake process; and
    removing the second conductive layer exposed by the second mask pattern to form a second conductive layer pattern.

9. The method as claimed in claim 8, wherein:
    a height of the first conductive layer pattern that extends along the side surface of the first trench is a first height and a height of the second conductive layer pattern that extends along the side surface of the second trench is a second height, and
    the first height is substantially equal to the second height.

10. A method for fabricating a semiconductor device, the method comprising:
    forming an interlayer insulating layer on a substrate, the interlayer insulating layer including a first trench and a second trench;
    forming a first conductive layer along side and bottom surfaces of the first trench and a second conductive layer along side and bottom surfaces of the second trench;
    forming a first pre-mask pattern and a second pre-mask pattern filling parts of the first trench and the second trench on the first conductive layer and the second conductive layer, respectively;
    changing the first pre-mask pattern and the second pre-mask pattern into a first mask pattern and a second mask pattern through a first bake process;
    removing the first conductive layer exposed by the first mask pattern to form a first conductive layer pattern;
    removing the second conductive layer exposed by the second mask pattern to form a second conductive layer pattern; and
    removing the second conductive layer pattern.

11. The method as claimed in claim 10, wherein:
    each of the first and second pre-mask patterns is a developable bottom anti-reflective coating (dBARC) pattern, and
    each of the first and second mask patterns is a bottom anti-reflective coating (BARC) pattern.

12. The method as claimed in claim 10, wherein the first trench is formed in a PMOS region and the second trench is formed in an NMOS region.

13. The method as claimed in claim 12, wherein:
each of the first conductive layer and the second conductive layer includes a p-type work function regulating layer, and
each of the first conductive layer and the second conductive layer includes at least one of TaN or TiN.

14. The method as claimed in claim 10, wherein the forming of the first pre-mask pattern and the second pre-mask pattern includes:
forming a pre-mask film filling the first trench and the second trench on the first conductive layer and the second conductive layer;
thermally treating the pre-mask film through a second bake process; and
wet etching-back the thermally treated pre-mask film to expose part of the first conductive layer formed on the side surface of the first trench and part of the second conductive layer formed on the side surface of the second trench.

15. The method as claimed in claim 14, wherein the first conductive layer pattern and the second conductive layer pattern are formed using a wet etching.

* * * * *